United States Patent
Klingler et al.

(10) Patent No.: US 6,795,030 B2
(45) Date of Patent: Sep. 21, 2004

(54) ELECTROMAGNETIC COMPATIBILITY TESTING DEVICE

(75) Inventors: Marco Klingler, Lille (FR); Jean Rioult, Lille (FR); Jean-Pierre Ghys, Sameon (FR)

(73) Assignee: Institut National de Recherche sur les Transports et leur Securite (INRETS), Acrueil (FR)

( * ) Notice: Subject to any disclaimer, the term of this patent is extended or adjusted under 35 U.S.C. 154(b) by 0 days.

(21) Appl. No.: 10/276,521

(22) PCT Filed: Apr. 5, 2001

(86) PCT No.: PCT/FR01/01025

§ 371 (c)(1),
(2), (4) Date: May 6, 2003

(87) PCT Pub. No.: WO01/88554

PCT Pub. Date: Nov. 22, 2001

(65) Prior Publication Data

US 2003/0184324 A1 Oct. 2, 2003

(30) Foreign Application Priority Data

May 16, 2000 (FR) ............................................. 00 06193

(51) Int. Cl.⁷ ............................................... H01Q 17/00
(52) U.S. Cl. ........................................ 343/703; 324/627
(58) Field of Search ......................... 343/703; 324/627, 324/628

(56) References Cited

U.S. PATENT DOCUMENTS

| | | | | |
|---|---|---|---|---|
| 4,837,581 A | * | 6/1989 | Hansen et al. | 343/703 |
| 5,404,098 A | * | 4/1995 | Osburn | 324/95 |
| 5,430,456 A | * | 7/1995 | Osburn et al. | 343/703 |
| 5,585,808 A | * | 12/1996 | Wysome | 343/703 |
| 5,825,331 A | * | 10/1998 | Lee | 343/703 |
| 5,844,413 A | * | 12/1998 | Hansen et al. | 324/627 |
| 5,910,729 A | * | 6/1999 | Yun | 324/627 |
| 6,127,980 A | * | 10/2000 | Podgorski | 343/703 |

FOREIGN PATENT DOCUMENTS

WO    WO 97/34158    9/1997

* cited by examiner

*Primary Examiner*—Tho Phan
(74) *Attorney, Agent, or Firm*—Young & Thompson

(57) ABSTRACT

A testing device for measuring radiation, immunity and electromagnetic characteristics of an object to be tested (1), includes a conductive structure (53) enclosing a testing volume where the object can be placed, the structure being provided with an opening (56) capable of being closed. The testing device further includes a set of internal conductors called septa (52), at least two in number, each septum defining in the testing volume, by its configuration in the structure, an electromagnetic coupling with the object; at least a septum is arranged in such a way that its electromagnetic plane is separate and not parallel to the electromagnetic plane of at least another septum.

11 Claims, 9 Drawing Sheets

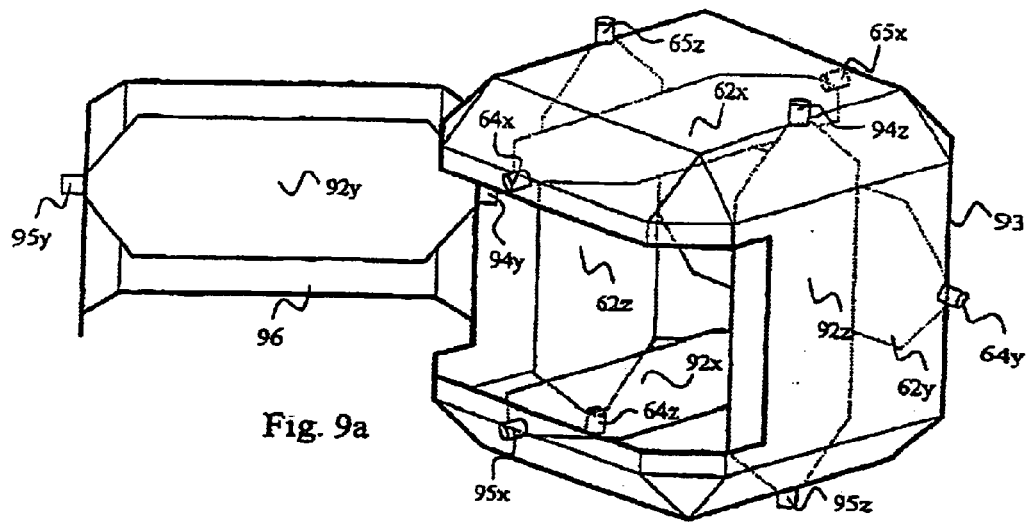
Fig. 9a
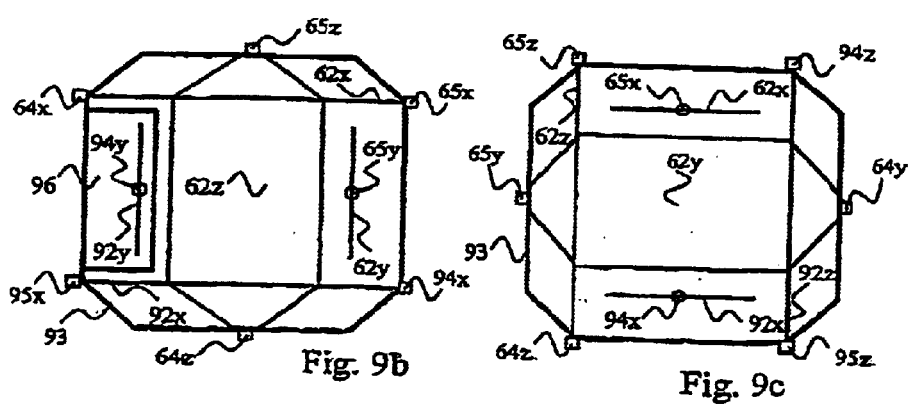
Fig. 9b
Fig. 9c
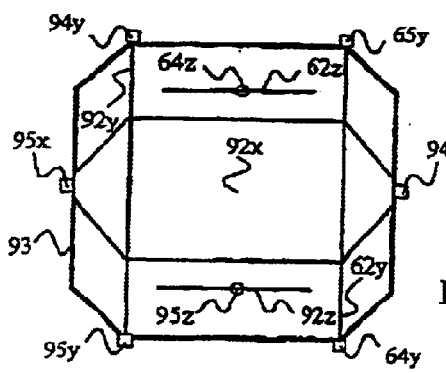
Fig. 9d

ELECTROMAGNETIC COMPATIBILITY TESTING DEVICE

The subject of the invention is a test device for measuring the electromagnetic radiation, immunity and characteristics of an object to be tested, comprising a conducting structure enclosing a test volume in which said object may be placed, said structure being provided with a closable aperture, said test device also including a system of internal conductors called septa, these being at least two in number, each septum being composed of at least one elementary conductor, each septum being connected to at least one and to at most two connectors passing through the structure, each connector being connected to at least one septum, each septum defining, in said test volume, by its arrangement in the structure, an electromagnetic coupling with said object, said electromagnetic coupling being specified by an electric coupling vector and a magnetic coupling vector defining an electromagnetic coupling plane.

Such devices are known and used at the present time, these being called transverse electromagnetic cells (TEM cells) which are distinguished principally by the geometry of their metal structure, by the number, shape and construction of the septa, by the arrangement of said septa in the structure and by the number of connectors.

The publication IEEE Transactions on Electromagnetic Compatibility Vol. 16, No. 4, November 1974: *"Generation of Standard EM Fields using TEM Transmission Cells"* (M. Crawford) describes the conventional TEM cell and its use for creating electromagnetic fields for the purpose of measuring the electromagnetic immunity of objects to be tested. The metal structure, of polyhedral shape, of this cell comprises a central section of parallepipedal shape between two pyramidal transition sections. Placed at each end of the transition sections is a connector that connects the two ends of a septum of hexagonal shape located at mid-height inside the structure. This cell is limited only in terms of high frequencies by the appearance of resonant modes that depend on the dimensions of the cavity formed by the metal structure, above which frequencies the transverse electromagnetic coupling mode is no longer verified.

The National Bureau of Standards Report NBS No. TN-1059 (PB83-165274) of October 1982: *"A Method to Quantify the Radiation Characteristics of an Unknown Interference Source"* (M. T. Ma and G. H. Koepke) describes a method of measuring electromagnetic radiation using a conventional TEM cell with one septum and two connectors, in which the object on test is placed in succession in several positions.

U.S. Pat. No. 4,837,581 describes a TEM cell of pyramidal shape whose septum of triangular shape is connected, on the one hand, to a connector placed at the end of the structure formed by the apex of the pyramidal shape and, on the other hand, to an array of loads which is connected to the other end of the structure formed by the base of the pyramidal shape. This cell, called a GTEM cell, has the feature of also possessing a system of elements that absorb the electromagnetic waves on the internal wall connected to the array of loads, making it possible to use it at frequencies well above those of the conventional TEM cell.

U.S. Pat. Nos. 5,754,054; 5,404,098; 5,825,331 and 5,430,456 describe methods of measuring electromagnetic radiation which are distinguished from the measurement method described in NBS Report No. TN-1059 by the number of positions and the orientations of the object to be tested and by the use of a GTEM cell.

U.S. Pat. No. 5,589,773 describes a radiation measurement method and a positioning system suitable for a GTEM cell, said positioning system making it possible to facilitate and automate the changes of orientation of the equipment under test.

Patent JP 05312866A describes a conventional TEM cell comprising a system for inserting the object to be tested, while Patent JP 05005763A describes a conventional TEM cell comprising, in the internal volume of the structure, elements intended for stirring the electromagnetic radiation.

U.S. Pat. No. 5,585,808; DE 3 925 247 A1; JP 02203281A; JP 04353774A; JP 05264620A and JP 06242161A describe TEM cells having a septum which are distinguished by the geometrical shape of their structure and by the geometrical shape and the arrangement of the septum inside the structure. Patent JP 10267975A describes a TEM cell which is distinguished from the cell described in patent JP 06242161A in that the internal walls of the structure are covered with a material that absorbs the electromagnetic energy.

U.S. Pat. No. 5,910,729 describes a TEM cell having two septa, each of them being connected at its two ends to a connector. The symmetrical arrangement of the two septa is designed to improve the electromagnetic coupling performance. U.S. Pat. No. 5,942,903 describes a TEM cell which is essentially distinguished from the cell described by U.S. Pat. No. 5,910,729 by the shape of the structure, by the particular construction of the septa and by their connection at one end to an array of loads. U.S. Pat. No. 5,861,753 describes a TEM cell which is distinguished from that described by U.S. Pat. No. 5,942,903 by the shape of the structure and in that it has three septa and two connectors, two of the three septa being arranged symmetrically in the structure and connected to only one of the connectors via a coupler.

U.S. Pat. No. 5,793,215 describes a TEM cell which is distinguished from the TEM cell described by U.S. Pat. No. 5,910,729 in that it has three septa of cylindrical shape which are connected to the two ends of the structure via six bushing connectors. Patent JP 11174102A describes a TEM cell which is essentially distinguished from the TEM cell described by U.S. Pat. No. 5,793,215 in that the three septa are of flat shape.

Patent JP 10185981A describes a TEM cell of mainly cylindrical shape, comprising a septum that rotates about the longitudinal axis of the structure, said septum being connected to a connector at each end of the structure. Furthermore, the TEM cell includes a rotary support for rotating the object on test about the vertical axis. Patent DE 196 01 348 C1 describes a TEM cell having a single two-position rotary septum.

U.S. Pat. Nos. 5,327,091 and 5,530,412 describe two methods of stirring the modes of a resonant cavity formed by a closed metal structure not provided with a septum, called a mode-stirring reverberation chamber inside which are placed in particular the object on test and an antenna transmitting electromagnetic energy.

In the abovementioned U.S. Pat. Nos. 5,910,729; 5,942,903; 5,861,753; 5,793,215 and KR 97-64814 comprising at least two septa, the electromagnetic coupling planes of said septa in the test volume are coincident, that is to say the electric and magnetic coupling vectors associated with each septum are oriented in a plane perpendicular to the longitudinal axis of the TEM cells. This is also the case with the TEM cells having a rotary septum that are described in patents KR 96-57363 and DE 196 01 348 C1, whatever the arrangement of the septum in the cell. In all cases, the electromagnetic characterization of the objects under test is therefore carried out in a two-dimensional reference frame of the same electromagnetic coupling plane. The TEM cells described in those patents have mainly been developed for measuring the electromagnetic characteristics of objects in several electromagnetic coupling polarizations within the same plane, in particular the vertical and horizontal polarizations, so as to reproduce the measurements made on an open site or in an anechoic chamber in which the object to be tested is placed at a certain distance from an antenna polarized vertically and then horizontally. The three-dimensional electromagnetic characterization of the object on test can then be obtained only by changing the orientation of the object on test in the test volume, as indicated in the NBS report No. TN-1059 and the U.S. Pat. Nos. 5,754,054; 5,404,098; 5,825,331; 5,430,456 and 5,589,773.

In the mode-stirring reverberation chambers described in the abovementioned U.S. Pat. Nos. 5,327,091 and 5,530,412, the electromagnetic coupling planes in the test volume are produced by a multitude of electromagnetic waves emanating from the transmitting antenna and reflected by the conducting walls of the metal structure. At resonant frequencies of the cavity of the structure, the superposition of all of these coupling planes in the test volume gives the object on test a statistically isotropic character over a mode-stirring cycle, whatever the orientation of said object to be tested. This test device and its operation are nevertheless dependent on the geometrical dimensions of the structure, which define the first resonant frequency of the cavity and on the minimum frequency for which the isotropic character of the object on test is obtained over a stirring cycle.

In the same way as the mode-stirring reverberation chambers, and unlike the known TEM cells, the test device forming the subject matter of the invention makes it possible to avoid manipulating the equipment under test by the particular arrangement of the septa in the structure and in addition allows simultaneous measurements to be taken. This constitutes an advantage of the test devices forming the subject matter of the invention. To achieve this objective, the test device forming the subject matter of the invention has at least two septa, at least one of these septa is placed in such a way that its electromagnetic coupling plane is distinct and not parallel to the electromagnetic coupling plane of at least one other septum.

According to a first variant of the invention, the test device has three septa placed in the structure in such a way that their electromagnetic coupling planes taken in pairs are distinct and nonparallel. Furthermore, according to this first variant, the electromagnetic coupling planes taken in pairs may be orthogonal.

According to a second variant of the invention, the test device has two groups of three septa, the septa of each group being placed in the structure in such a way that their electromagnetic coupling planes taken in pairs are distinct and nonparallel. Furthermore, according to this second variant the electromagnetic coupling planes of each of these groups taken in pairs may be orthogonal. In the test devices forming the subject matter of the invention, the structure may be polyhedral in shape and more particularly parallepipedal in shape or else cubic in shape.

In general, the dimensions of the polyhedral shape of the test device forming the subject matter of the invention may be chosen, on the one hand, in order to fix the first resonant frequency of the cavity of the structure and, on the other hand, in order to increase the number of high-frequency resonant modes of the cavity. Thus, the test device forming the subject matter of the invention could benefit from the complementary properties of TEM cells and of mode-stirring reverberation chambers. In particular, when the structure is parallelepipedal in shape, the ratios of the dimensions of this shape, taken in pairs, may be irrational numbers.

Furthermore, all or part of the internal surface of the structure of a test device forming the subject matter of the invention may be covered with a material that absorbs electromagnetic energy and the internal volume of this structure may include elements intended for stirring the electromagnetic radiation.

FIG. 1 shows schematically and in perspective, with a partial view of the inside, a conventional TEM cell having one septum and two connectors, the central part of which cell is parallelepipedal in shape.

FIG. 2 shows schematically and in perspective, a partial view of the inside, a GTEM cell of pyramidal shape having one septum and one connector, said cell being described in U.S. Pat. No. 4,837,581.

FIG. 3 shows schematically and in perspective a TEM cell having three septa and six connectors, said cell being described in U.S. Pat. No. 5,793,215.

FIGS. 4a and 4b show schematically two longitudinal sections of a TEM cell having three septa and two connectors, said cell being described in U.S. Pat. No. 5,861,753.

FIGS. 5a to 5d show a generic embodiment of a test device forming the subject matter of the invention, which is characterized by the arrangement of three septa whose electromagnetic coupling planes taken in pairs are orthogonal and whose structure is parallelepipedal in shape. FIG. 5a is a perspective representation, with a partial view of the inside; FIGS. 5b to 5d are cross sections through three orthogonal planes passing through the centre of the object to be tested.

FIGS. 8a to 8d show a particular embodiment of a test device forming the subject matter of the invention derived from the test device shown in FIGS. 7a to 7d, which is distinguished from the latter by another arrangement of the septa.

FIGS. 9a to 9d show a particular embodiment of a test device forming the subject matter of the invention which externally is similar to the test device shown in FIGS. 6a to 6d, which is characterized in that it has two groups of three septa. For each group of septa, the electromagnetic coupling planes taken in pairs are orthogonal.

Figure 1:
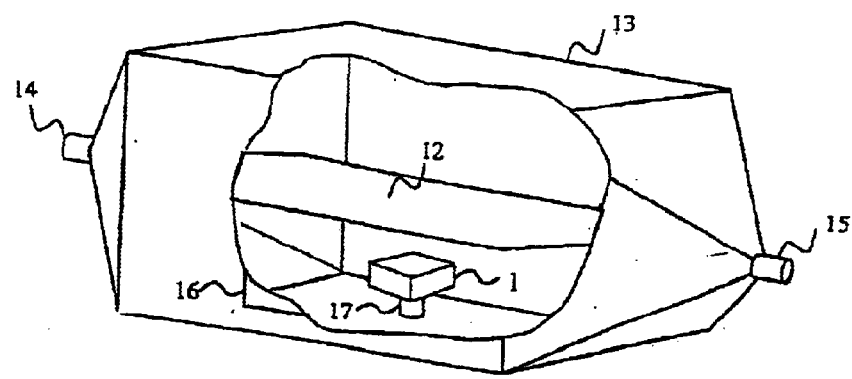

In FIG. 1, which shows a conventional TEM cell whose central part is parallelepipedal in shape, it may be seen that the conducting structures 13 having a closable aperture 16; found inside this structure 13 are the septum 12, connected to the connectors 14 and located at the ends of said structure, and the object on test 1 whose electromagnetic characteristics it is desired to measure, this object being supported by an insulating dielectric support 17.

Figure 2:
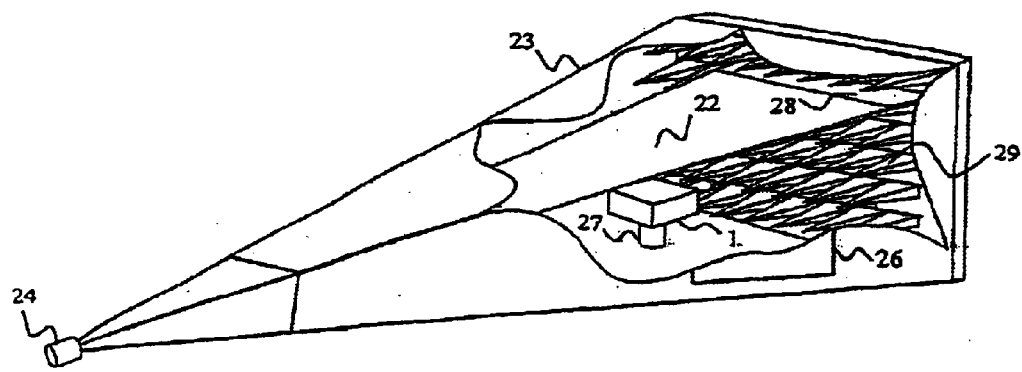

In FIG. 2, which shows a GTEM cell of pyramidal shape described in U.S. Pat. No. 4,837,581, may be seen the conducting structure 23 having a closable aperture 26; found inside this structure are the septum 22, connected on the one hand to the connector 24 located at one end of said structure and on the other hand to an array of loads 28 at the other end of said structure, and the object on test 1 whose electromagnetic characteristics it is desired to measure, this object being supported by an insulating dielectric support 27. An array of absorbing elements 29 cover the internal wall at that end of the cell where said array of loads lies.

Figure 3:
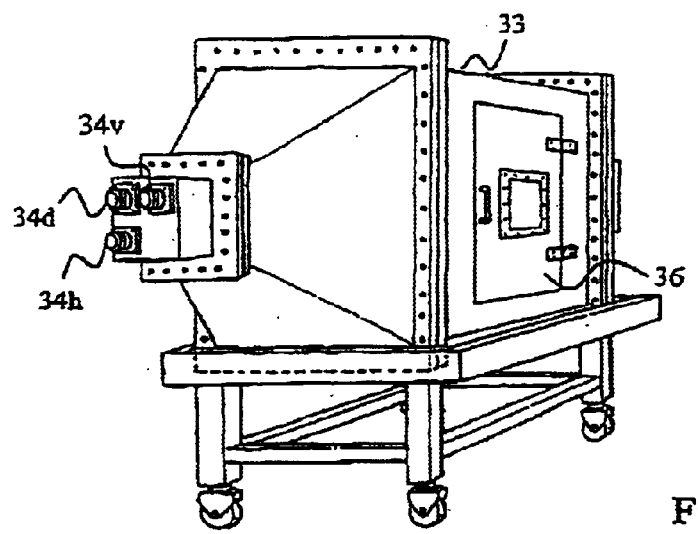

In FIG. 3, which shows a TEM cell having three septa and six connectors, described in U.S. Pat. No. 5,793,215, may be seen the conducting structure 33 having a closable aperture 36 and three of the six connectors 34v, 34h and 34d located at one end of said structure.

Figure 4A:
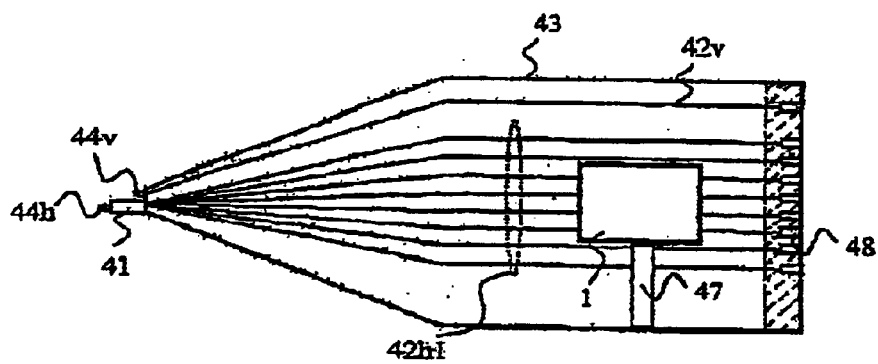
Figure 4B:
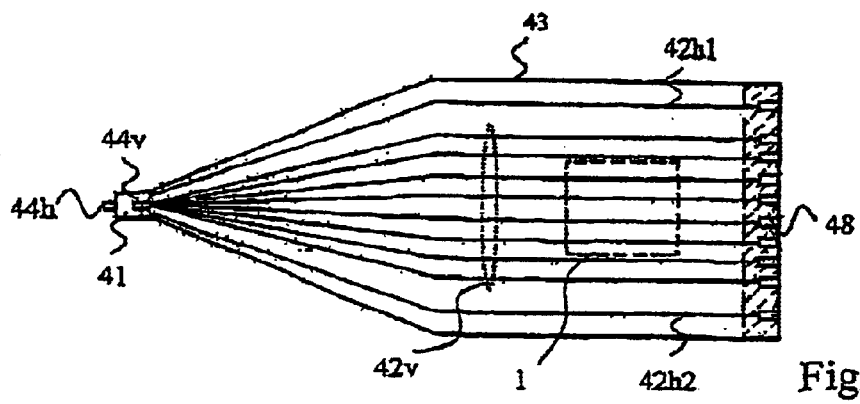

In FIGS. 4a and 4b which show two sections of a TEM cell having three septa and two connectors described in U.S. Pat. No. 5,861,753, may be seen the conducting structure 43 inside which may be found the object to be tested 1, supported by an insulating dielectric support 47, the septa 42v, 42h1 and 42h2 connected to one end of the structure via an array of loads 48; the septum 42v is connected to the other end of the connector 44v, while the septa 42h1 and 42h2 are connected to the connector 44h via the coupler 41.

In FIGS. 5a to 5d, which show schematically a test device according to the invention, parallelepipedal in shape, may be seen the conducting structure 53 having a closable aperture 56; found inside this structure are the septa 52x, 52y and 52z, connected to the pairs of connectors 54x and 55x, 54y and 55y, 54z and 55z respectively, located on the three adjacent walls of said structure, and the object on test 1 whose electromagnetic characteristics it is desired to measure, this object being supported by an insulating dielectric support 57.

In FIGS. 6a to 6d, which show schematically a particular embodiment of a test device forming the subject matter of the invention derived from the test device shown in FIGS. 5a to 5d, may be seen the conducting structure 63 having a closable aperture 66; found inside this structure are the septa 62x, 62y and 62z, connected to the pairs of connectors 64x and 65x, 64y and 65y, 64z and 65z respectively, located on three adjacent walls of said structure, and the object on test 1 whose electromagnetic characteristics it is desired to measure, this object being supported by an insulating dielectric support 67.

In FIGS. 7a to 7d, which show schematically a particular embodiment of a test device forming the subject matter of the invention, may be seen the conducting structures 73 having a closable aperture 76; found inside this structure are the septa 72x, 72y and 72z, connected to the pairs of connectors 74x and 75x, 74y and 75y, 74z and 75z respectively, located on three adjacent walls of said structure, and the object on test 1 whose electromagnetic characteristics it is desired to measure, this object being supported by an insulating dielectric support 77.

In FIGS. 8a to 8d, which show schematically a particular embodiment of a test device forming the subject matter of the invention, may be seen the conducting structure 83 having a closable aperture 86; found inside this structure are the septa 82x, 82y and 82z, connected to the pairs of connectors 84x and 85x, 84y and 85y, 84z and 85z respectively, located on three adjacent walls of said structure, and the object on test 1 whose electromagnetic characteristics it is desired to measure, this object being supported by an insulating dielectric support 87.

In FIGS. 9a to 9d, which show schematically a particular embodiment of a test device forming the subject matter of the invention, may be seen the conducting structure 93 having a closable aperture 96; found inside this structure are the septa 62x, 62y, 62z, 92x, 92y and 92z, connected to the pairs of connectors 64x and 65x; 64y and 65y and 64z and 65z, 94x and 95x, 94y and 95y, 94z and 95z respectively, located on the six walls of said structure.

Figure 10A:
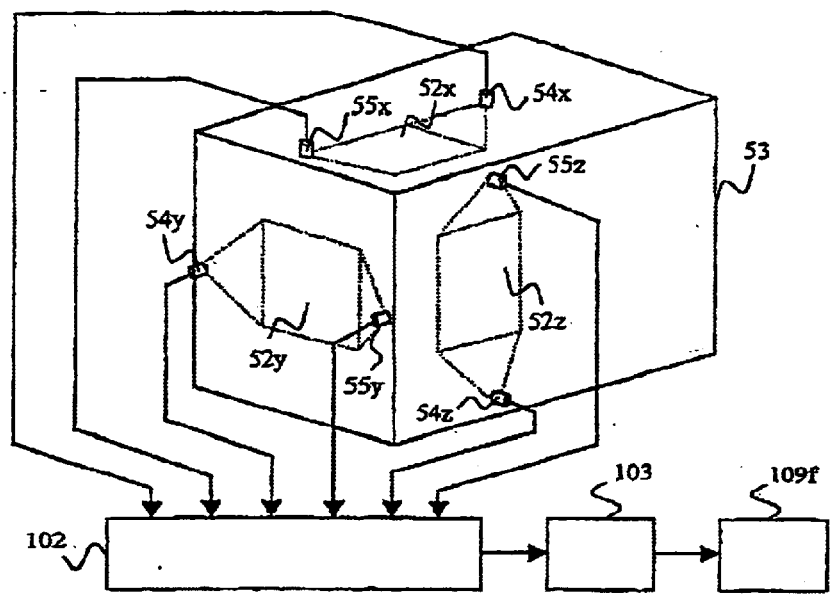
FIGS. 10a and 10b show two examples of the use of a test device forming the subject matter of the invention having three septa whose electromagnetic coupling planes in the test volume taken in pairs are orthogonal, for electromagnetic radiation measurement applications.

In FIG. 10a it may be seen the test device described in FIGS. 5a to 5d, in particular its structure 53, its pairs of connectors 54x and 55x, 54y and 55y, 54z and 55z which connect the ends of the septa 52x, 52y and 52z respectively to a recorder 103 in the frequency domain by means of a channel selector 102, and the electromagnetic radiation frequency analyzer 109f. This test device applies, for example, the electromagnetic radiation measurement method described in the National Bureau of Standards Report NBS No. TN-1059 (PB83-165274) of October 1982: "A Method to Quantify the Radiation Characteristics of an Unknown Interference Source" (M. T. Ma and G. H. Koepke) for a conventional TEM cell having two connectors. With the test device shown in FIG. 10a this method is employed in a similar manner, by successively measuring the powers received at the connectors 54x and 55x, 54y and 55y, 54z and 55z, for the same position of the object on test in the test volume.

Figure 5A:
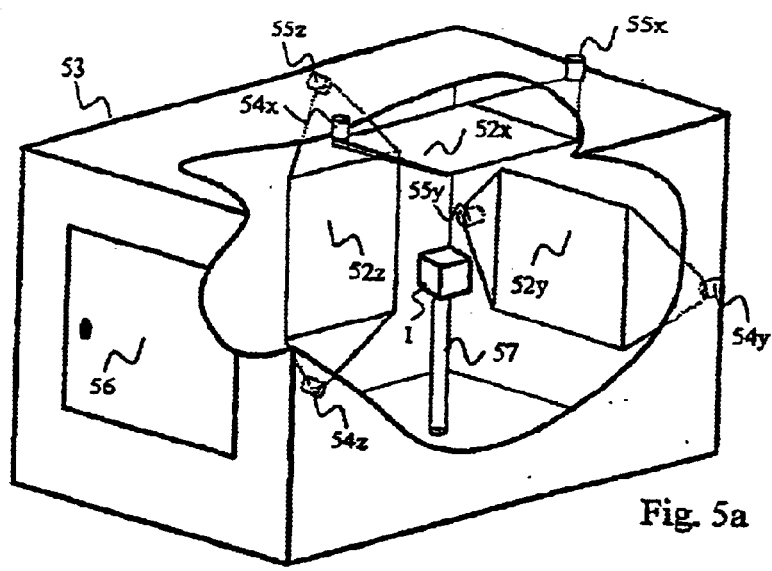
Figure 5B:
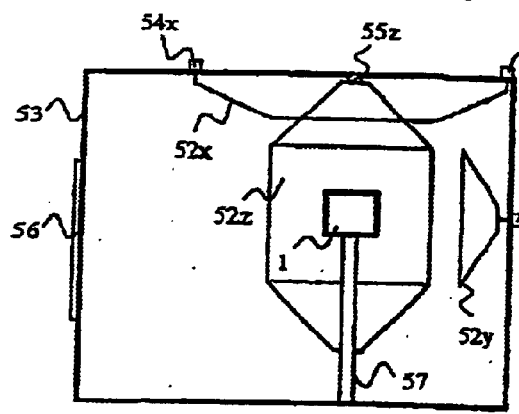
Figure 5C:
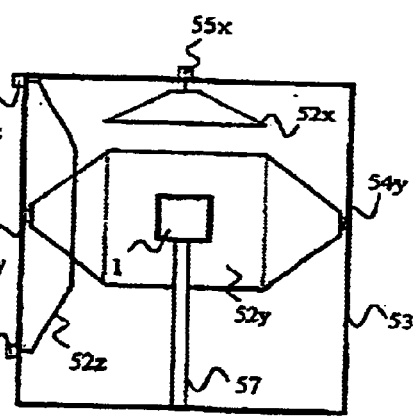
Figure 5D:
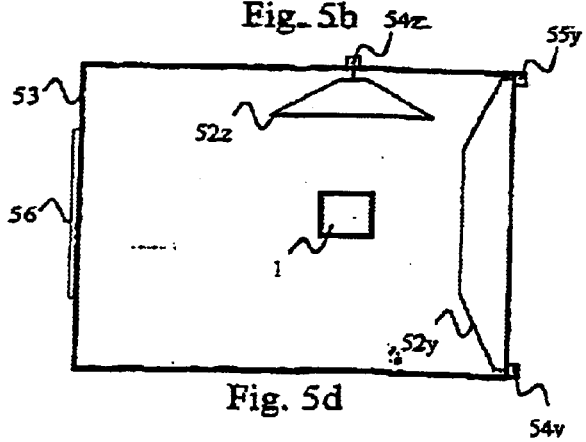
Figure 6A:
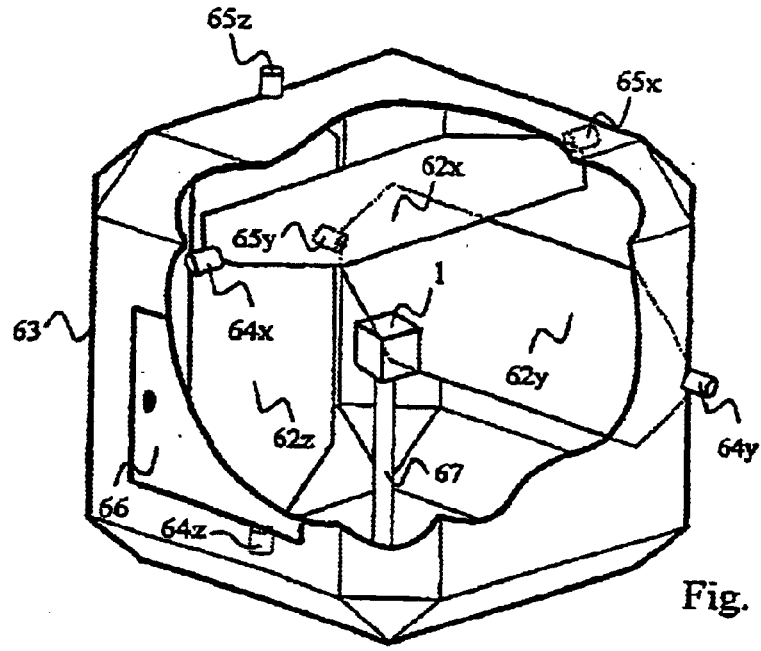
FIGS. 6a to 6d show a particular embodiment of a test device forming the subject matter of the invention, derived from the test device shown in FIGS. 5a to 5d, the structure of which is polyhedral in shape, derived from a cubic shape.
Figure 6B:
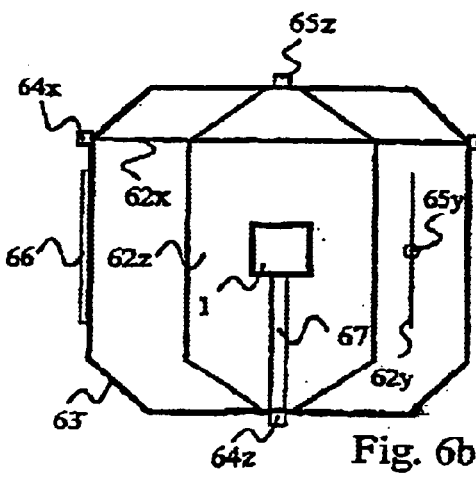
Figure 6C:
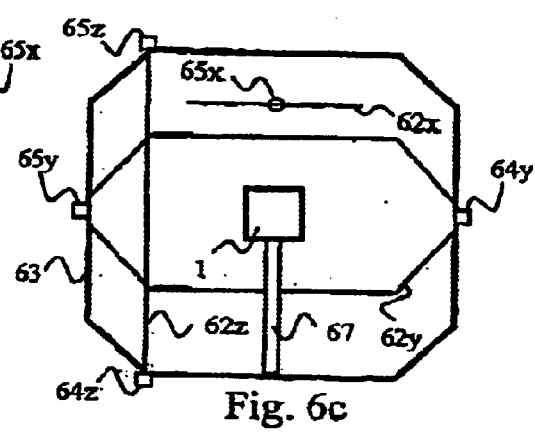
Figure 6D:
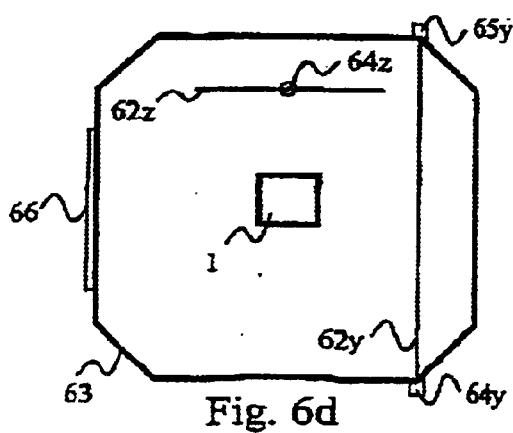
Figure 7A:
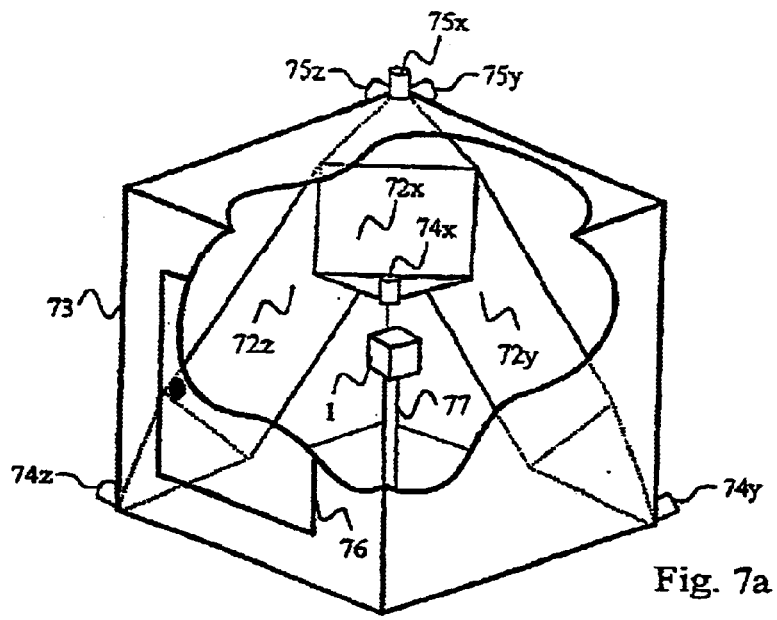
FIGS. 7a to 7d show a particular embodiment of a test device forming the subject matter of the invention which is characterized in that it has three septa whose electromagnetic coupling planes taken in pairs are distinct and nonparallel and whose structure is cubic in shape.
Figure 7B:
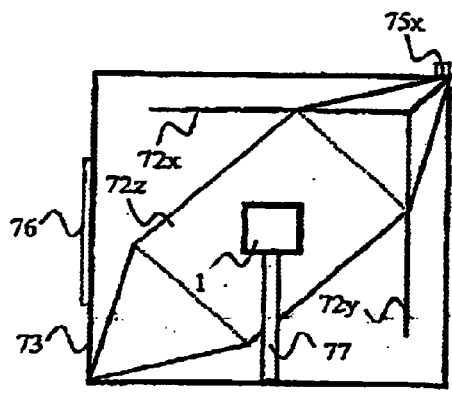
Figure 7C:
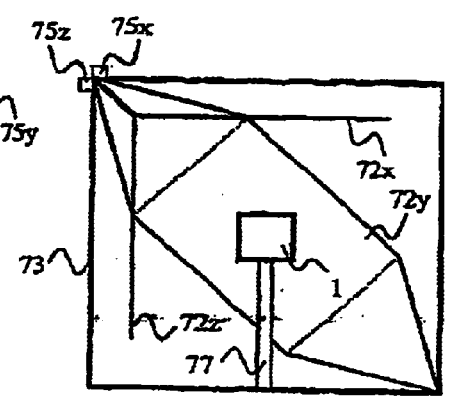
Figure 7D:
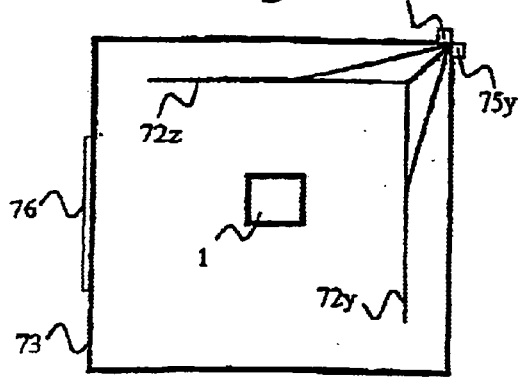
Figure 8A:
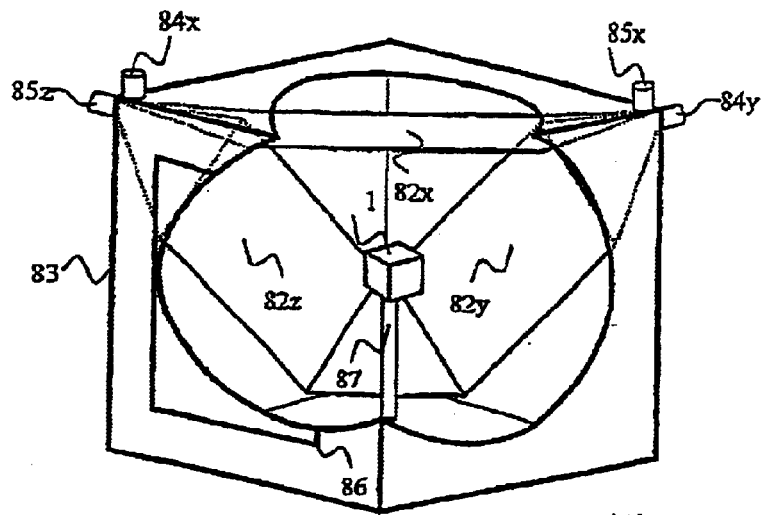
Figures 8C, 8D:
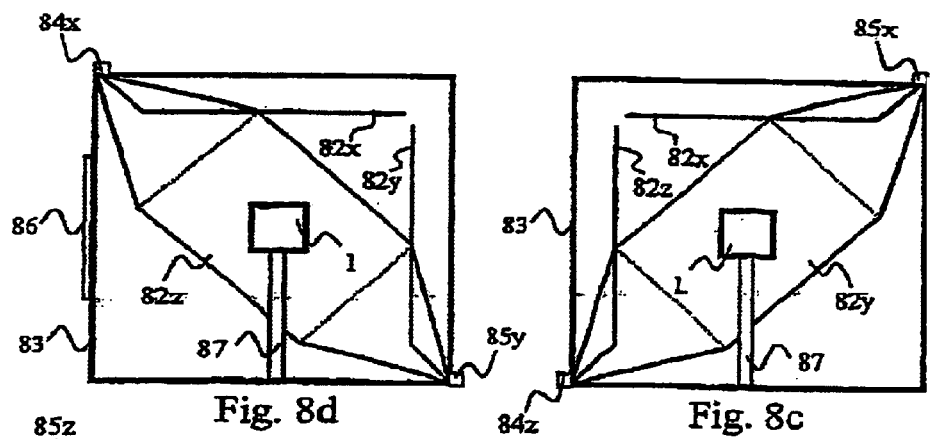
Figure 8D:
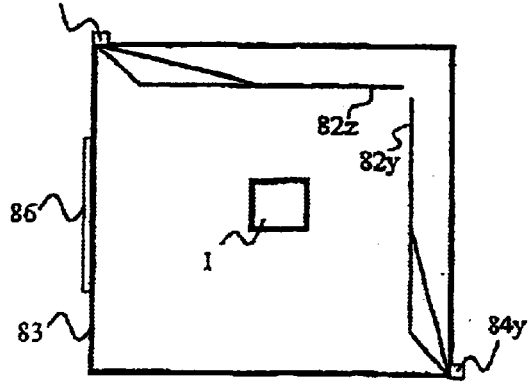
Figure 10B:
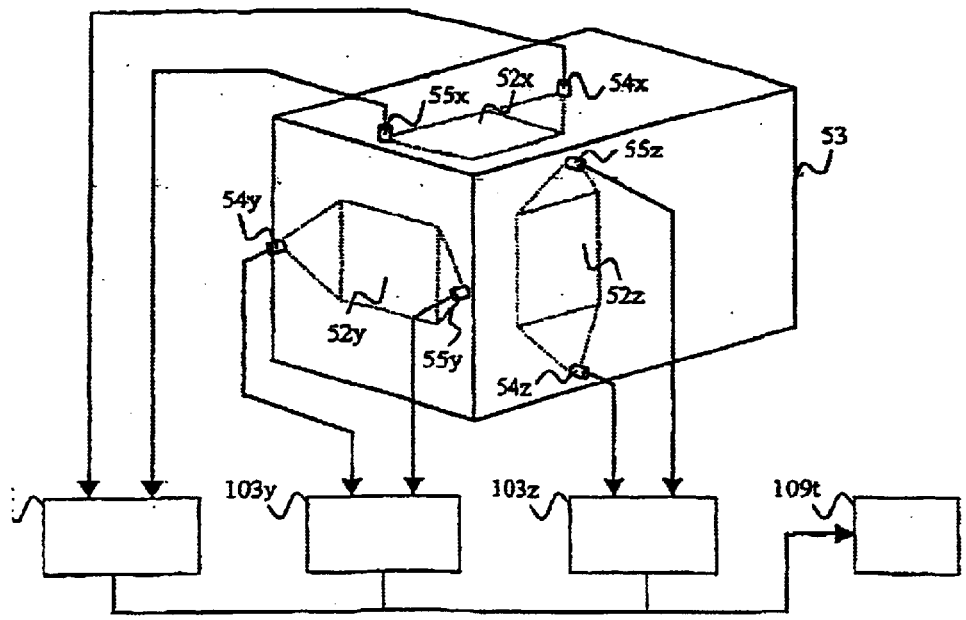

In FIG. 10b it may be seen the test device depicted in FIGS. 5a and 5d, in particular its structure 53, its pairs of connectors 54x and 55x, 54y and 55y, 54z and 55z which connect the ends of the septa 52x, 52y and 52z respectively to the respective recorders 103x, 103y and 103z in the temporal domain, and the electromagnetic radiation temporal analyzer 119. This test device applies, for example, the electromagnetic radiation measurement method described in patent application FR 99/11364 for a conventional TEM cell having two connectors or for a GTEM cell having one connector. With the device shown in FIG. 10b, this method is employed in a similar manner, by simultaneously measuring the voltages received at the connectors 54x and 55x, 54y and 55y, 54z and 55z for the same position of the object on test in the test volume.

Figure 11:
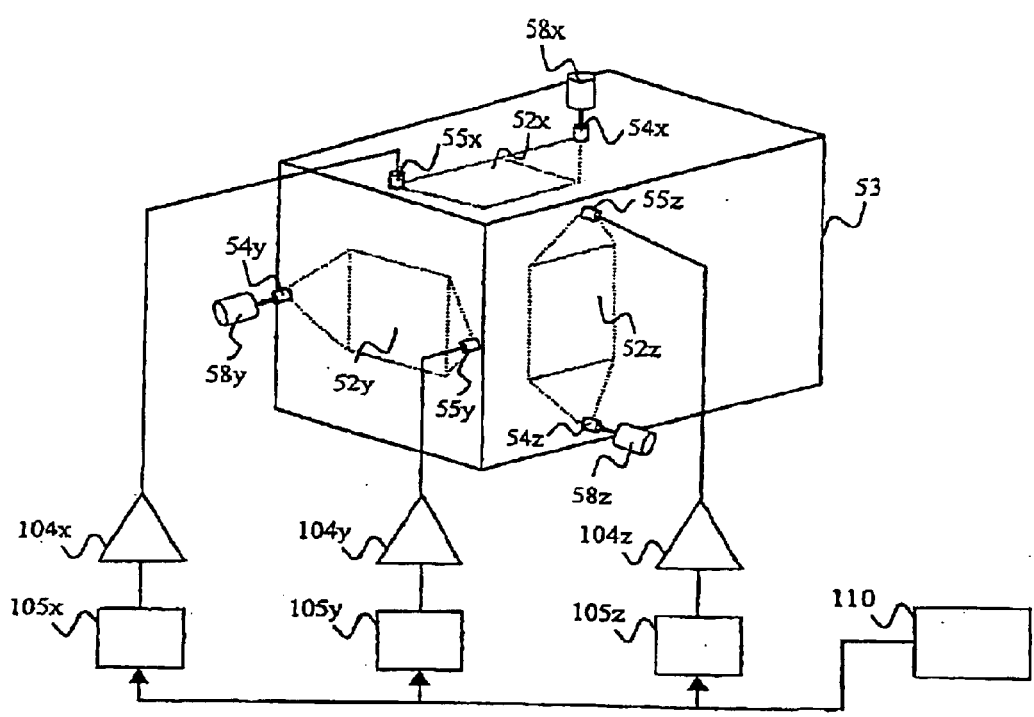
FIG. 11 shows an example of the use of a test device forming the subject matter of the invention having three septa whose electromagnetic coupling planes in the test volume taken in pairs are orthogonal, for electromagnetic immunity measurement applications.

In the FIG. 11 may be seen the test device depicted in FIGS. 5a to 5d, in particular its structure 53 and a control device 110 that controls the frequency synthesizers 105x, 105y and 105z; the outputs of said synthesizers are amplified by the amplifiers 104x, 104y and 104z respectively, the outputs of which are connected to the septa 52x, 52y and 52z via the connectors 55x, 55y and 55z respectively; the bushing connectors 54x, 54y and 54z connect the other end of said septa to the matching loads 58x, 58y and 58z respectively. This test device applies, for example, the electromagnetic immunity measurement method described in the publication IEEE Transactions on Electromagnetic Compatibility, Vol. 16, No. 4 of November 1974: "Generation of Standard EM Fields using TEM Transmission Cells" (M. Crawford) by transmitting, successively or simultaneously, electrical powers to one of the two connectors at the ends of each septum 52x, 52y and 52z so as to create an electromagnetic field in the test volume where the object on test is placed.

What is claimed is:

1. A test device for measuring the electromagnetic radiation, immunity and characteristics of an object (1) to be tested, comprising a conducting structure (53) enclosing a test volume in which said object may be placed, said structure being provided with a closable aperture (56), said test device also including a system of internal conductors called septa (52), these being at least two in number, each septum being composed of at least one elementary conductor, each septum being connected to at least one and to at most two connectors (54 and 55) passing through the structure, each connector being connected to at least one septum, each septum defining, in said test volume, by its arrangement in the structure, an electromagnetic coupling with said object, said electromagnetic coupling being specified by an electric coupling vector and a magnetic coupling vector defining an electromagnetic coupling plane, characterized in that at least one septum is placed in such a way that its electromagnetic coupling plane is distinct and not parallel to the electromagnetic coupling plane of at least one other septum.

2. The test device as claimed in claim 1, characterized in that it has three septa placed in such a way that their electromagnetic coupling planes taken in pairs are distinct and nonparallel.

3. The test device as claimed in claim 2, characterized in that the electromagnetic coupling planes of the septa taken in pairs are orthogonal.

4. The test device as claimed in claim 1, characterized in that it has two groups of three septa, the septa of each group being placed in such a way that their electromagnetic coupling planes taken in pairs are distinct and nonparallel.

5. The test device as claimed in claim 4, characterized in that the septa of each group are placed in such a way that their electromagnetic coupling planes taken in pairs are orthogonal.

6. The test device as claimed in claim 1, characterized in that the structure is polyhedral in shape.

7. The test device as claimed in claim 6, characterized in that the structure is parallelepipedal in shape.

8. The test device as claimed in claim 7, characterized in that the ratios of the dimensions of the parallelepipedal shape of the structure, taken in pairs, are irrational numbers.

9. The test device as claimed in claim 7, characterized in that the structure is cubic in shape.

10. The test device as claimed in claim 1, characterized in that all or part of the internal surface of the structure is covered with a material that absorbs electromagnetic energy.

11. The test device as claimed in claim 1, characterized in that the internal volume of the structure includes elements intended for stirring the electromagnetic radiation.

* * * * *